United States Patent [19]

Matsumoto

[11] Patent Number: 4,929,994
[45] Date of Patent: May 29, 1990

[54] SOLID-STATE IMAGING DEVICE WITH MULTIPLE DIELECTRIC LAYERS

[75] Inventor: Kazuya Matsumoto, Ina, Japan

[73] Assignee: Olympus Optical Co., Ltd., Tokyo, Japan

[21] Appl. No.: 177,280

[22] Filed: Apr. 4, 1988

[30] Foreign Application Priority Data

Apr. 28, 1987 [JP] Japan .................................. 62-103135

[51] Int. Cl.$^5$ ............................................. H01L 27/14
[52] U.S. Cl. .................................. 357/30; 357/23.15; 357/59; 357/54
[58] Field of Search ................. 357/30 I, 30 G, 23.15, 357/54, 24 LR, 59 G, 30 D, 30 H, 30 S, 30 L, 54 N

[56] References Cited

U.S. PATENT DOCUMENTS 4,223,330 9/1980 Koike et al. .................... 357/30 I X
4,686,559 8/1987 Haskell .................................. 357/54

FOREIGN PATENT DOCUMENTS 58-192377 11/1983 Japan ................................. 357/23.15
61-84059 of 1986 Japan .

OTHER PUBLICATIONS

Abbas et al, "Improvement of the Gate-Region Integrity in FET Devices," *IBM Technical Disclosure Bulletin*, vol. 14, No. 11, Apr. 1972, 3348–50.

Bhattacharyya et al, "High–Density, Single–Device Memory Cell with Minimized Parasitic Leakage," *IBM Technical Disclosure Bulletin*, vol. 18, No. 6, Nov. 1975, p. 1756.

*Primary Examiner*—William Mintel
*Attorney, Agent, or Firm*—Armstrong, Nikaido, Marmelstein, Kubovcik & Murray

[57] ABSTRACT

A solid-state imaging device uses an MIS light-receiving device having a multilayer film structure. The multilayer film structure is constituted in such a manner that intermediate films are interposed between a gate electrode disposed on a surface of a semiconductor with a gate insulating film therebetween. A protection film is formed above the gate electrode, and/or between the gate electrode and the gate insulating film. Each intermediate film has a refractive index of a value between those of the materials forming the above components. As a result of the thus-constituted multilayer film structure, light transmissivity can be improved, causing a reduction in deterioration in light sensitivity. Consequently, a solid-state imaging device, which has a highly sensitive MIS light-receiving device, can be obtained.

3 Claims, 5 Drawing Sheets

SOLID-STATE IMAGING DEVICE WITH MULTIPLE DIELECTRIC LAYERS

FIELD OF THE INVENTION

This invention relates to a solid-state imaging device which uses an MIS light-receiving device comprising a photoelectrical conversion portion and a signal storage portion.

BACKGROUND OF THE INVENTION

Conventionally, a variety of types of solid-state imaging devices comprises an MIS light-receiving device which has a photoelectrical conversion portion and a signal storage portion. One solid-state imaging device, using a MIS light-receiving device, has the MIS light-receiving device comprising a photoelectrical conversion portion and a signal storage portion and has an internal amplifying function. As an example of the type described above, a solid-state imaging device which uses a light-receiving device called a CMD (Charge Modulation Device) is disclosed by the inventor of the present invention in Japanese Patent Laid-Open No. 84059/1986 and is described in the thesis "A NEW MOS IMAGE SENSOR OPERATING IN A NON-DESTRUCTIVE READOUT MODE" on pages 353 to 356 of pre-published thesis for the International Electron Device Meeting (IEDM) held in 1986.

The cross-sectional structure of a CMD light-receiving device which forms a pixel of a solid-state imaging device of the conventional type is shown in FIG. 1. In FIG. 1, reference numeral 1 represents a p⁻ substrate and reference numeral 2 represents an n⁻ epitaxial layer which is formed on the p⁻ substrate 1 and which forms a channel layer. Reference numeral 3 represents an n+ source layer or drain layer diffused in the epitaxial layer 2. Reference numeral 4 represents an n+ drain layer or a source layer which is also diffused in the epitaxial layer 2. Reference numeral 5 represents a gate insulating film disposed over the epitaxial layer 2, and reference numeral 6 represents a gate electrode which is disposed above the epitaxial layer 2 with the gate insulating film 5 therebetween. Reference numeral 7 represents a protection film (passivation film) of an insulating material formed over the gate electrode 6.

The operation of receiving light by means of a CMD light-receiving device having the structure of the type described above will now be described. When light 8 is incident from a position above the gate electrode 6, the incidental light 8 is introduced into the channel layer 2 through the protection film 7, gate electrode 6, and the gate insulating film 5. Hole-electron pairs are generated in the channel layer 2. The holes of the hole-electron pairs are stored in a boundary plane between the gate insulating film 5 and the n⁻ channel layer 2. The boundary plane is positioned immediately beneath the gate electrode 6 to which a reverse bias is applied. As a result of this bias, the potential at the surface of the n⁻ channel layer 2 rises, causing the potential barrier against the electrons present between the source layer 3 and the drain layer 4 to drop, and causing the electron current to pass through the n⁻ channel layer 2. An optical amplified signal can be obtained by reading this current flow.

In the CMD light-receiving device having the structure described above, the incidental light 8 is introduced into the n⁻ channel layer 2 through the protection film 7, gate electrode 6, and the gate insulating film 5. During this time, reflections and absorptions are generated by multi-interference effects in the multilayer film structure formed by air/protection film/gate electrode film/gate insulating film/n⁻ channel layer. As a result, part of the incidental light vanishes. This phenomenon deteriorates the sensitivity of the light-receiving devices.

Therefore, in the conventional light-receiving devices, the thickness of each film forming the above-described multilayer film structure must be made the most suitable value for the purpose of improving sensitivity. For example, a case will now be described in which the gate electrode is formed by a polysilicon film with the use of an Si-substrate, and a thermally oxidized $SiO_2$ is used as the gate insulating film. It is known that when the film thickness of the polysilicon of the gate electrode is set to 400 Å to 800 Å, good transmissivity is shown when the film thickness of the $SiO_2$ which forms the gate insulating film is 1000 Å or less, and in the vicinity of 1500 Å, 3400 Å, and 5100 Å.

However, so long as the polysilicon is used for the gate electrode and the thermally-oxidized $SiO_2$ film is used for the gate insulating film, the improvement in the transmissivity of light is limited. This fact will now be briefly described. That is, in general, reflectance R at the boundary plane between layers of different refractive indexes is expressed by the following equation, where that the refractive indexes are $n_1$ and $n_2$, and $n_1 > n_2$:

$$R = \frac{(n_1/n_2 - 1)^2}{(n_1/n_2 + 1)^2}$$

As can clearly be seen from this equation, as the ratio of $n_1$ to $n_2$ increases, the reflectance R increases.

In the light-receiving device whose structure is described above, a $SiO_2$ film is often used for the protection film, while a thermally-oxidized $SiO_2$ film is generally used for the gate insulating film. The gate electrode is formed by a thin polysilicon film. In this case, the refractive index of the polysilicon is up to 4, while the refractive index of the $SiO_2$ is 1.45. Therefore, the ratio of the two refractive indexes is large, which increases reflection when multi-interference occurs, and reduces transmissivity.

An example of light transmissivity is shown in FIG. 2 in which the results of calculations of transmissivity of light which is in the visible radiation range (wavelength: 400 to 700 nm) is shown, assuming that the protection film is formed by $SiO_2$, the thickness of the same is 24000 Å, the thickness of the polysilicon film of the gate electrode is 600 Å, and the thickness of the gate insulating film formed by $SiO_2$ is 350 Å. As can clearly be seen from this figure, the transmissivity of light in the vicinity of 600 nm is decreased by the reflection of light from the multilayer film.

SUMMARY OF THE INVENTION

An object of the present invention is to overcome the above-described problems of the solid-state imaging device which uses an MIS light-receiving device that comprises a conventional photoelectrical conversion portion and signal storage portion, and to provide a solid-state imaging device which uses an MIS light-receiving device having a photoelectric conversion portion, which exhibits a high degree of light sensitivity and a signal storage portion for the purpose of overcoming any deterioration in sensitivity due to the multilayer film structure.

In order to overcome the above described problems, a solid-state imaging device using an MIS light-receiving device which has a photoelectrical conversion portion and a signal storage portion comprises: an intermediate film which is interposed between a gate electrode and a protection film which is disposed above gate electrode, and/or between a gate electrode and a gate insulating film which is disposed beneath the gate electrode. The intermediate film has a refractive index of an intermediate value between those of the component materials.

As a result of the structure described above, a solid-state imaging device can be obtained in which deterioration in light sensitivity due to the multilayer film structure can be prevented and an MIS light-receiving device is used. The MIS light-receiving device has a photoelectrical conversion portion, which exhibits a high level of sensitivity, and a signal storage portion.

DETAILED DESCRIPTION OF THE INVENTION

Figure 3A:
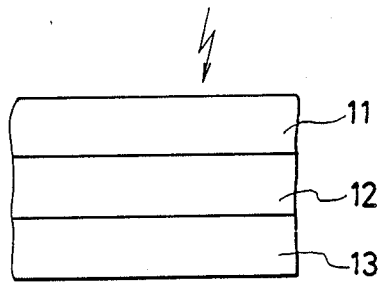
FIG. 3A is a schematic view illustrating a multilayer film structure of the conventional light-receiving device.

Referring to schematic views shown in FIGS. 3A and 3B, the present invention will now be described in detail. FIG. 3A shows a conventional multilayer film structure comprising a protection film 11 having a refractive index of $n_2$, a gate electrode 12 having a refractive index of $n_1$, and a gate insulating film 13 having a refractive index of $n_2$. In a multilayer film structure of the type described above, if both the ratio of the refractive index of the gate electrode 12 and the protection film 11 $n_1/n_2$ ($n_1 > n_2$) and the ratio of the refractive index of the gate electrode 12 and the gate insulating film 13 $n_1/n_2$ ($n_1 > n_2$) are large, reflectance at the boundary plane becomes, as described above, large. As a result of this, light transmissivity at the multilayer film is reduced, deteriorating the light sensitivity.

Figure 3B:
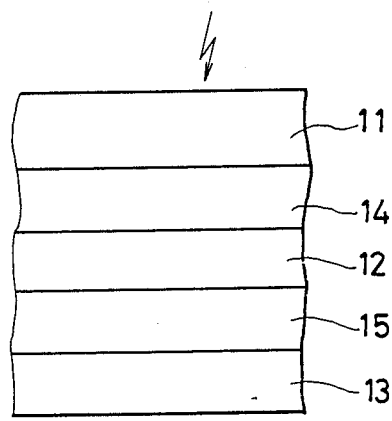
FIG. 3B is a schematic view illustrating the structure of the multilayer film of the light-receiving device according to the present invention.

In the present invention, as shown in FIG. 3B, intermediate films 14 and 15 made of transparent dielectric substances each having a refractive index of $n_3$ ($n_1 > n_3 > n_2$) are interposed between the protection film 11 having a refractive index of $n_2$ and the gate electrode 12 having a refractive index of $n_1$, and between the gate electrode 12 having a refractive index of $n_1$ and the gate insulating film 13 having a refractive index of $n_2$, so that a multilayer film structure is formed. As a result of the thus-constituted structure, reflectance at each boundary layer of the multilayer film is reduced, and the light transmissivity of the entire multilayer film can be improved.

In a MIS light-receiving device which uses a silicon semiconductor and includes a gate electrode made of a polysilicon film (refractive index $n_1 \approx 4.0$), a protection film made of $SiO_2$, and a gate insulating film made of $SiO_2$ (refractive index $n_2 = 1.45$), a film of $Si_3N_4$ (refractive index $= 2.0$) or $Ta_2O_5$ (refractive index $= 2.37$) is used as a transparent dielectric film which is interposed between the above components.

DETAILED DESCRIPTION OF THE PREFERRED EMBODIMENTS

Figure 1:
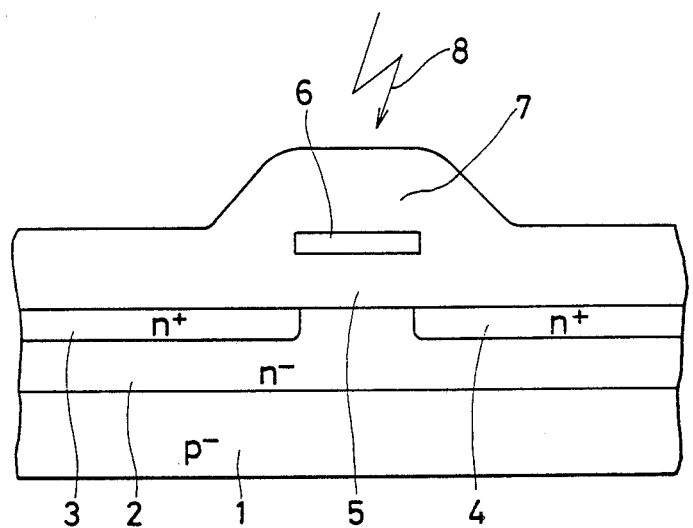
FIG. 1 is a schematic cross-sectional view of a solid-state imaging device in which a conventional CMD light-receiving device is used.
Figure 4:
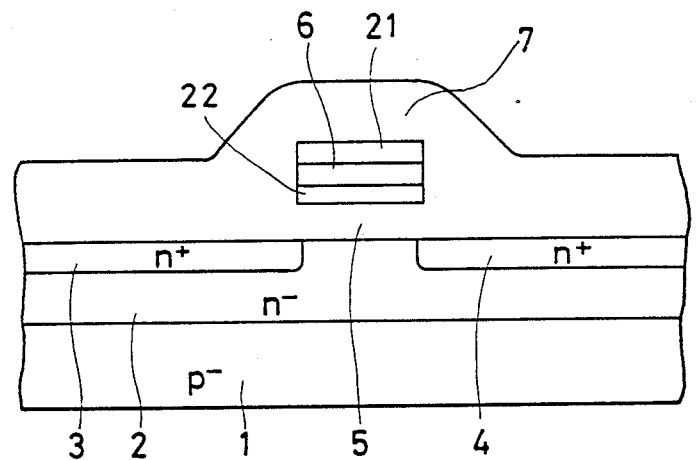
FIG. 4 is a schematic cross-sectional view of a first embodiment of the present invention.

A solid-state imaging device according to an embodiment of the present invention will now be described. FIG. 4 illustrates a partial schematic cross-sectional structure according to a first embodiment of the present invention, in which the present invention is applied to a solid-state imaging device using a CMD light-receiving device. The same or equivalent components as those of the conventional device shown in FIG. 1 are given the same reference numerals. Reference numeral 21 represents a first intermediate film made of a transparent dielectric substance which is disposed between the protection film (passivation film) 7 and the gate electrode 6. The first intermediate film 21 has a refractive index of a value between that of the protection film 7 and that of a film which forms the gate electrode 6. Reference numeral 22 represents a second intermediate film made of a transparent dielectric substance which is disposed between the gate electrode 6 and the gate insulating film 5. The second intermediate film 22 has a refractive index of a value between that of the film which forms the gate electrode 6 and that of the gate insulating film 5.

An example of the materials of this multilayer film structure will now be described.

Figure 2:
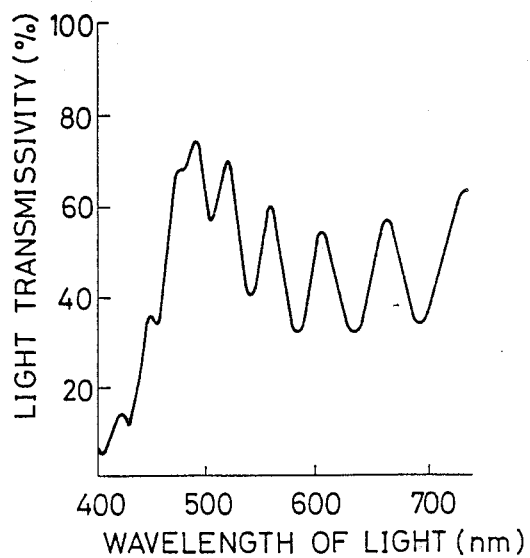
FIG. 2 illustrates the results of calculations of the light transmissivity of the light-receiving device shown in FIG. 1.
Figure 5:
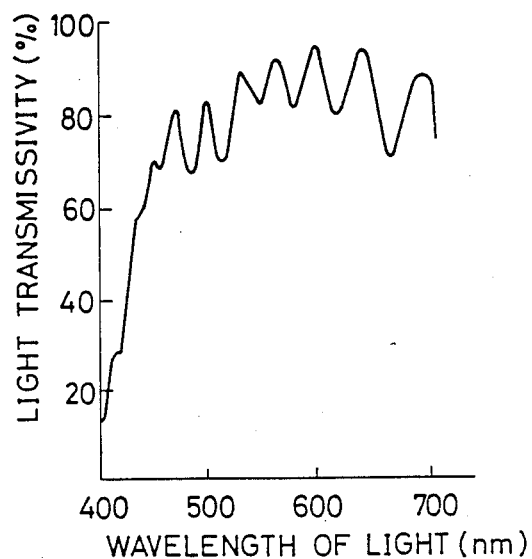
FIG. 5 illustrates results of calculations of light transmissivity provided by the first embodiment.

The protection film 7 is made of an $SiO_2$ film with a film thickness of 24000 Å, the first intermediate film 21 is made of a $Si_3N_4$ film with a film thickness of 600 Å, and the gate electrode 6 is made of a polysilicon film with a film thickness of 600 Å. The second intermediate film 22 is made of a $Si_3N_4$ film with a film thickness of 900 Å, and the gate insulating film 5 is made of a $SiO_2$ film with a film thickness of 350 Å. FIG. 5 illustrates the results of calculations of light transmissivity of the thus-formed multilayer film for different wavelengths of light. In comparison with the light transmissivity of the conventional light-receiving device shown in FIG. 2, this embodiment exhibits a high level of light transmissivity throughout the visible radiation range.

Although in the above-described first embodiment, the first and second intermediate films are arranged to be disposed respectively above and beneath the gate electrode 6, the intermediate film may be arranged to be disposed either above or beneath the gate electrode 6 for the purpose of obtaining a higher light transmissivity than that of the conventional light-receiving device. Second and third embodiments of the type described above will now be described.

Figure 6:
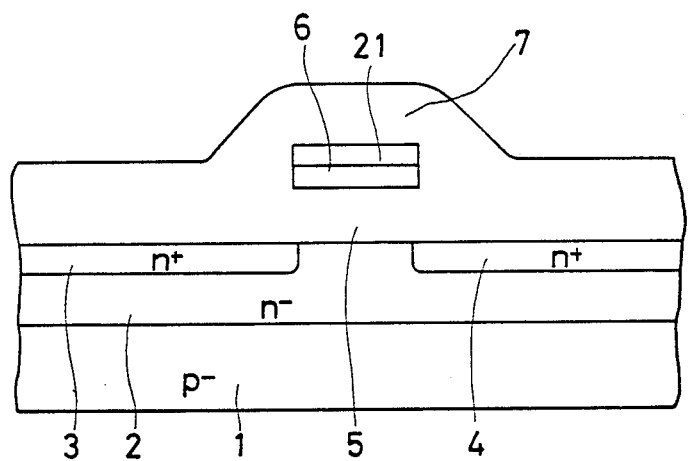
FIG. 6 is a schematic cross-sectional view of an second embodiment of the present invention.

FIG. 6 is a schematic cross-sectional view illustrating a second embodiment of the present invention. In this embodiment, the intermediate film 21 is only interposed above the gate electrode 6, that is, between the gate electrode 6 and the protection film 7. In this embodiment, the second intermediate film 22 according to the first embodiment, shown in FIG. 4, is omitted.

Figure 7:
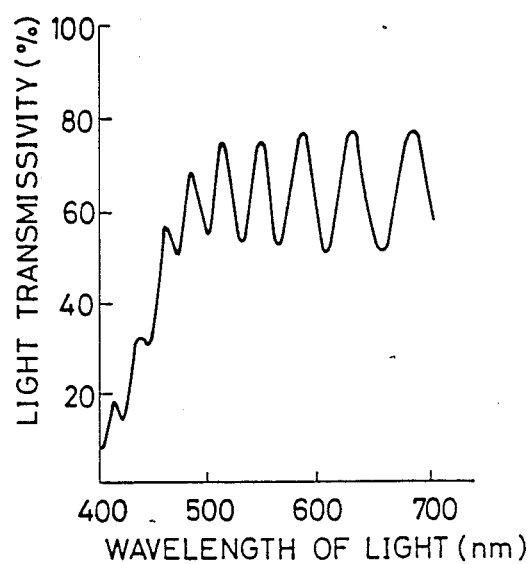
FIG. 7 illustrates results of calculations of light transmissivity provided by the second embodiment.

The materials of the components of the multilayer film structure according to this embodiment will now be described. The protection film 7 is made of a $SiO_2$ film with a film thickness of 24000 Å, the intermediate film 21 is made of a $Si_3N_4$ film with a film thickness of 650 Å, the gate electrode 6 is made of a polysilicon film with a film thickness of 600 Å, and the gate insulating film 5 is made of a $SiO_2$ film with a film thickness of 350 Å. FIG. 7 illustrates results of calculations of light transmissivity of the thus-formed multilayer film structure of the light-receiving device. As can clearly be seen from this figure, in this embodiment as well, a higher transmissivity than that of the conventional device can be obtained.

Figure 8:
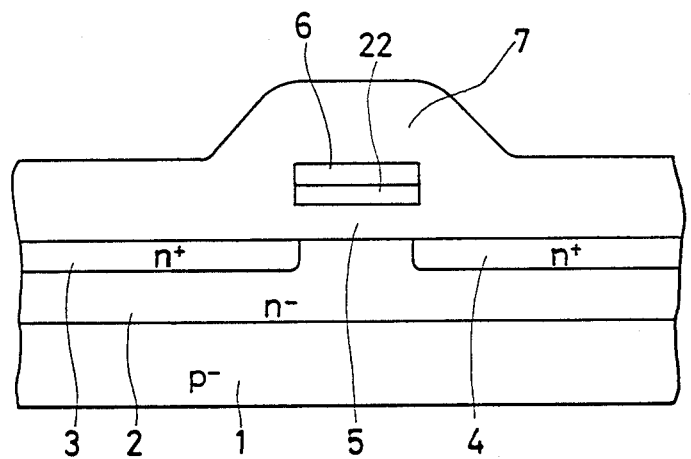
FIG. 8 is a schematic cross-sectional view of a third embodiment of the present invention.

FIG. 8 is a schematic cross-sectional view of a third embodiment of the present invention, in which the intermediate film 22 is arranged to be only disposed beneath the gate electrode 6, that is, only between the gate electrode 6 and the gate insulating film 5, and from which the first intermediate film 21 of the first embodiment, shown in FIG. 4, is omitted.

Figure 9:
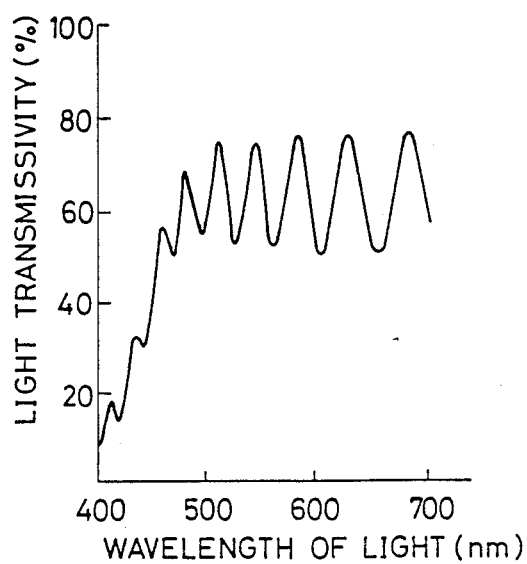
FIG. 9 illustrates results of calculations of light transmissivity provided by the third embodiment.

The materials of the components of the multilayer film structure according to this embodiment will now be described. The protection film 7 is made of a $SiO_2$ film with a film thickness of 24000 Å, the gate electrode 6 is made of a polysilicon film with a film thickness of 650 Å, the intermediate film 22 is made of a $Si_3N_4$ film with a film thickness of 600 to 900 Å, and the gate insulating film 5 is made of a $SiO_2$ film with a film thickness of 350 Å. FIG. 9 illustrates results of calculations of the light transmissivity of the thus-formed multilayer film structure of the light-receiving device. As can clearly be seen from this figure, in this embodiment as well, a higher transmissivity than that of the conventional device can be obtained.

Although the above embodiments deal with cases in which a CMD light-receiving device having an internal amplifying function is described, this invention can of course be applied to a solid-state imaging device which uses a MIS light-receiving device including another type of photoelectrical conversion portion and a signal storage portion such as a CCD. In the above embodiments, the material of the intermediate films which are disposed between the protection film and the gate electrode and/or between the gate electrode and the gate insulating film is exemplified by $Si_3N_4$ or $Ta_2O_5$. However, as an alternative to the above-described $Si_3N_4$ or $Ta_2O_4$, any material that has a refractive index $n_3$ between the refractive index $n_1$ of the gate electrode and that $n_2$ of the protection film and the gate insulating film, and which is a transparent dielectric substance, such as $Al_2O_3$ ($n_3=1.77$) or $TiO_2$ ($n_3=2.62$), may be employed.

As described above, according to the present invention, since a multilayer film structure which has a high level of light transmissivity is employed, a solid-state imaging device which uses an MIS light-receiving device including a photoelectrical conversion portion that exhibits a high sensitivity and a signal storage portion can be obtained. Consequently, the solid-state imaging device can be employed in a wider range of uses and applications.

What is claimed is:

1. A solid-state imaging device using an MIS light-receiving device which includes a photoelectrical conversion portion and a signal storage portion, said solid-state imaging device comprising:

a gate electrode disposed on a surface of a semiconductor with a gate insulating film, formed of $SiO_2$, therebetween, said gate electrode formed of a polysilicon film having a thickness of 600 Å;

a protection film formed on said gate electrode formed of $SiO_2$;

a first intermediate film disposed between said gate electrode and said protection film, and said first intermediate film formed of a $Si_3N_4$ film having a thickness of 600 Å; and a second intermediate film disposed between said gate electrode and said gate insulating film, and said second intermediate film formed of a $Si_3N_4$ film having a thickness of 900 Å wherein the thickness of each said film of said solid-state imaging device reduces a level of reflection between said films to enable maximum light transmissivity.

2. A solid-state imaging device using an MIS light-receiving device which includes a photoelectrical conversion portion and a signal storage portion, said solid-state imaging device comprising:

a gate electrode disposed on a surface of a semiconductor with a gate insulating film, formed of $SiO_2$, therebetween, said gate electrode formed of a polysilicon film having a thickness of 600 Å;

a protection film formed on said gate electrode, said protection film formed of $SiO_2$; and an intermediate film disposed between said gate electrode and said protection film, and said intermediate film formed of a $Si_3N_4$ film having a thickness of 650 Å wherein the thickness of each said film of said solid-state imaging device reduces a level of reflection between said films to enable maximum light transmissivity.

3. A solid-state imaging device using an MIS light-receiving device which includes a photoelectrical conversion portion and a signal storage portion, said solid-state imaging device comprising:

a gate electrode disposed on a surface of a semiconductor with a gate insulating film, formed of $SiO_2$, therebetween said gate electrode formed of a polysilicon film having a thickness of 650 Å;

a protection film of $SiO_2$ formed on said gate electrode; and an intermediate film disposed between said gate electrode and said gate insulating film, and said intermediate film formed of a $Si_3N_4$ film having a thickness within a range from 600 Å to 900 Å wherein the thickness of each said film of said solid-state imaging device reduces a level of reflection between said films to enable maximum light transmissivity.

* * * * *